United States Patent
Yu et al.

(10) Patent No.: US 11,309,785 B2
(45) Date of Patent: Apr. 19, 2022

(54) CONTROL CIRCUIT FOR CONTROLLING A POWER SWITCH AND ASSOCIATED CONTROL METHOD

(71) Applicant: Shenzhen Kiwi Instruments Corporation, Shenzhen (CN)

(72) Inventors: Xiufeng Yu, Hangzhou (CN); Bo Zhang, Hangzhou (CN); Weixiang Jin, Hangzhou (CN)

(73) Assignee: Shenzhen Kiwi Instruments Corporation, Nanshan Dist. (CN)

(*) Notice: Subject to any disclaimer, the term of this patent is extended or adjusted under 35 U.S.C. 154(b) by 0 days.

(21) Appl. No.: 17/134,040

(22) Filed: Dec. 24, 2020

(65) Prior Publication Data

US 2021/0152074 A1  May 20, 2021

(30) Foreign Application Priority Data

Dec. 27, 2019  (CN) .......................... 201911381728.2

(51) Int. Cl.
*H02M 1/08* (2006.01)
*H03K 4/06* (2006.01)
*H03K 5/24* (2006.01)

(52) U.S. Cl.
CPC ................ *H02M 1/08* (2013.01); *H03K 4/06* (2013.01); *H03K 5/24* (2013.01)

(58) Field of Classification Search
CPC .............. H02M 1/08; H03K 4/06; H03K 5/24

USPC .................................................. 327/108, 109
See application file for complete search history.

(56) References Cited

U.S. PATENT DOCUMENTS

| | | | | |
|---|---|---|---|---|
| 2012/0300499 A1* | 11/2012 | Chang | ..................... | H02M 1/36 363/16 |
| 2013/0100715 A1* | 4/2013 | Lin | ......................... | H02M 1/44 363/21.17 |
| 2015/0303898 A1* | 10/2015 | Zhai | ....................... | H03K 3/012 327/109 |
| 2015/0326116 A1* | 11/2015 | Zhang | ..................... | H02M 1/44 323/288 |
| 2017/0085185 A1* | 3/2017 | Wang | ..................... | H02M 1/44 |
| 2019/0348910 A1* | 11/2019 | Chou | ....................... | H02M 1/44 |

* cited by examiner

*Primary Examiner* — William Hernandez
(74) *Attorney, Agent, or Firm* — Perkins Coie LLP (57) ABSTRACT

A control circuit for controlling a power switch in a SMPS has a signal jittering circuit and a comparing circuit. The signal jittering circuit adds an overlapping signal into a current sensing signal indicative of current flowing through the power switch or into a current threshold signal, wherein the overlapping signal has a first frequency and an enveloping line of the overlapping signal has a second frequency, and wherein the second frequency is lower than the first frequency. The comparing circuit compares the current sensing signal and the current threshold signal, wherein when the current sensing signal is higher than the current threshold signal, the control circuit c turns off the power switch.

19 Claims, 5 Drawing Sheets

CONTROL CIRCUIT FOR CONTROLLING A POWER SWITCH AND ASSOCIATED CONTROL METHOD

CROSS-REFERENCE TO RELATED APPLICATIONS

This application claims priority to and the benefit of Chinese Patent Applications No. 201911381728.2, filed on Dec. 27, 2019, which are incorporated herein by reference in its entirety.

TECHNICAL FIELD

The present invention relates generally to electronic circuit, and more particularly but not exclusively relates to control circuit for controlling a power switch with signal jittering and associated control method.

BACKGROUND

The Electro-Magnetic Interference (EMI) problem exists widely in the electric products. The effective optimization of the EMI performance has also become an important part of improving product quality. In the Switching Mode Power Supply (SMPS), the EMI filter is usually coupled to the front end of a rectifier circuit to optimize the EMI performance of the circuit system. The method of frequency jittering can be adopted in order to optimize the EMI performance compared to the fixed frequency PWM control system. While the working frequency of the circuit system is decided by the peak current for the circuit system of the quasi-resonant mode (QR), it can be achieved by controlling the amplitude of the peak current to optimize the EMI performance of the circuit system.

Figure 1:
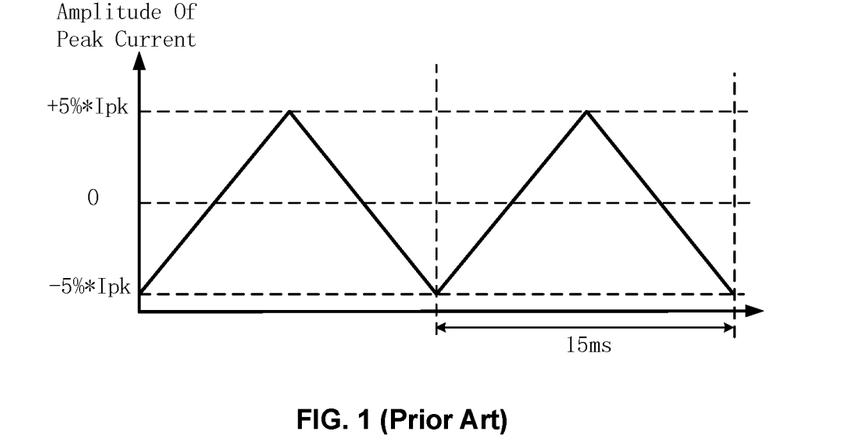
FIG. 1 illustrates a prior art overlapping signal that is added to the peak current threshold signal for jittering the amplitude of the peak current.
Figure 2:
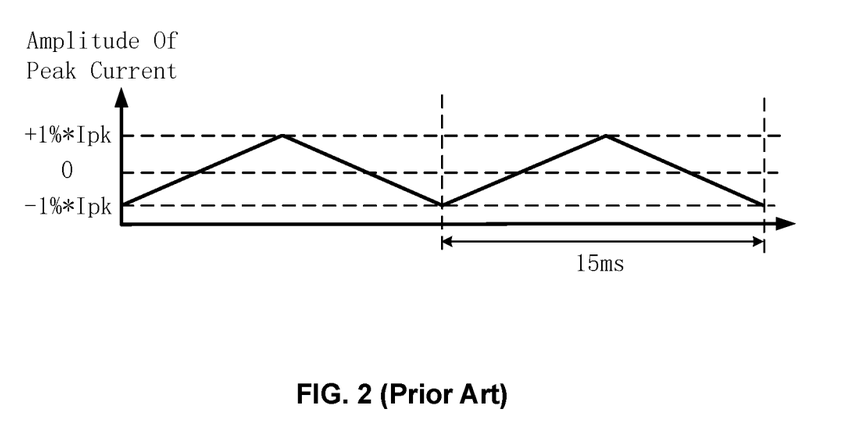
FIG. 2 illustrates the actual peak current jittering amplitude according to the prior art.

FIG. 1 illustrates a prior art overlapping signal that is added to the peak current threshold signal for jittering the amplitude of the peak current. However, due to the influence of loop feedback, the effect of the amplitude jittering of the peak current may be attenuated by the loop feedback, which makes the circuit system unable to meet the actual EMI optimization requirements. FIG. 2 illustrates the actual peak current jittering amplitude according to the prior art. The attenuation is determined by the response speed of the system loop and the frequency of the peak current jittering signal. If the frequency of the peak current jittering signal is low, and the response speed of the system loop is high enough, the effect of the amplitude jittering of the peak current will be attenuated by the adjustment of the system loop, which leads to the poor effect of the amplitude jittering. As shown in FIG. 1 and FIG. 2, the cycle period of the overlapping signal is set to be 15 ms, and the response speed of the system loop is much higher than the jittering frequency. The expected jittering amplitude of the peak current jittering is 5%, while the actual jittering amplitude of the peak current may be less than 1%. Therefore, the actual EMI optimization degree of the circuit system is limited.

Figure 3:
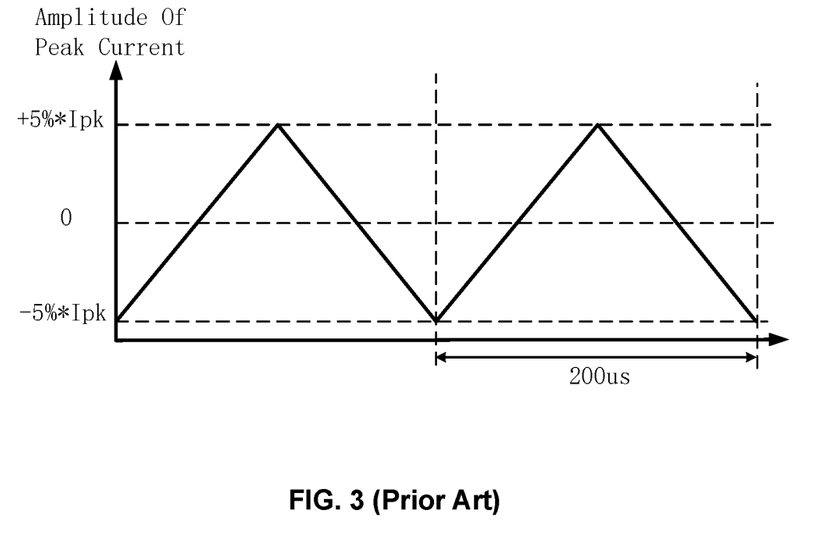
FIG. 3 illustrates a prior art overlapping signal with a higher frequency.
Figure 4:
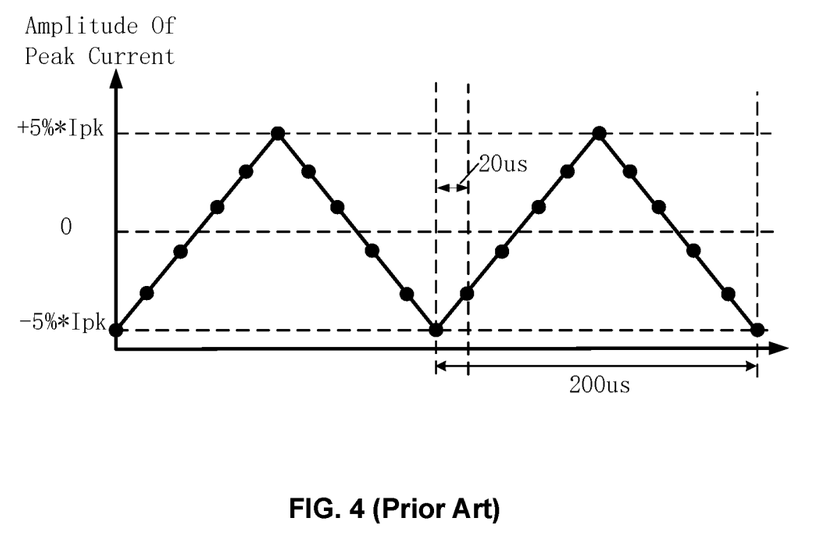
FIG. 4 illustrates the number of switching cycles in jittering cycle period according to the prior art in FIG. 3.

In order to improve the effect of the amplitude jittering of the peak current, the frequency of the overlapping signal can be improved. FIG. 3 illustrates a prior art overlapping signal with a higher frequency. As shown in FIG. 3, the cycle period of the overlapping signal for jittering the peak current is set to be 200 us, which has a same frequency level as the switching frequency. The response speed of the circuit system is limited, and the jittering amplitude of peak current cannot be attenuated by the system loop, and the actual effect of the amplitude jittering of the peak current is close to the expected value. However, there is another problem, that is, the switching frequency is close to the jittering frequency and the number of switching cycles are limited in one jittering cycle period. FIG. 4 illustrates the number of switching cycles in jittering cycle period according to the prior art in FIG. 3, wherein the switching cycle period is 20 us, and the circuit system has only 10 switching cycles in a cycle period of the overlapping signal, and the actual current peak value has only 5 levels, which makes the frequency divergence insufficient, and the degree of EMI optimization is still limited.

In view of at least one of the above deficiencies, an improved solution is required.

SUMMARY

In one embodiment, a control circuit for controlling a power switch in a SMPS comprising: a signal jittering circuit configured to add an overlapping signal into a current sensing signal indicative of current flowing through the power switch or into a current threshold signal, wherein the overlapping signal has a first frequency and an enveloping line of the overlapping signal has a second frequency, and wherein the second frequency is lower than the first frequency; and a comparing circuit configured to compare the current sensing signal with the current threshold signal, wherein when the current sensing signal is higher than the current threshold signal, the control circuit is configured to turn off the power switch.

In another embodiment, a control circuit for controlling a power switch in a SMPS comprising a peak current control circuit configured to turn off the power switch when current flowing through the power switch exceeds a threshold, and the peak current control circuit further configured to control the peak value of the current vary with a first frequency, and an enveloping line of the peak value vary with a second frequency, wherein the second frequency is lower than the first frequency.

And in yet another embodiment, a control method for controlling a power switch in a SMPS comprising jittering a current sensing signal indicative of the current flowing through the power switch with an overlapping signal or jittering a current threshold signal with an overlapping signal, wherein the overlapping signal varies with a first frequency and an enveloping line of the overlapping signal varies with a second frequency, wherein the first frequency is higher than the second frequency; and comparing the current sensing signal with the current threshold signal, and turning off the power switch when the current sensing signal is higher than the current threshold signal.

BRIEF DESCRIPTION OF THE DRAWINGS

Non-limiting and non-exhaustive embodiments are described with reference to the following drawings. The drawings are only for illustration purpose. Usually, the drawings only show part of the circuits/devices of the embodiments.

The drawings are only schematic and are non-limiting.

DETAILED DESCRIPTION

Reference will now be made in detail to the preferred embodiments of the application, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Throughout the specification and claims, the term "couple" or "connect" as used herein, is defined as either directly, or indirectly connecting one to another via intermediary such as via electrical conducting materials which may have resistance, parasitic inductance or capacitance, or via any other material(s) or component(s) as would be known to person skilled in the art without departure from the spirit and scope of the invention as defined by the appended claims.

According to one embodiment of the present application, a control circuit for controlling a power switch in a SMPS controls and jittering the peak value of the current flowing through the power switch of the SMPS. The SMPS can be in any suitable topology such as flyback converter, buck converter, and etc. In a preferred embodiment, the SMPS turns off the power switch when the current reaches a predetermined threshold and turns on the power switch when the current decreases to zero. In order to improve the EMI behavior, the control circuit adds an overlapping signal into either a current sensing signal indicative of the current flowing through the power switch to form a new current sensing signal or adds the overlapping signal into a base current threshold signal to form a current threshold signal for jittering the peak current, wherein the overlapping signal has a first frequency and varies with the first frequency, and an enveloping line of the overlapping signal has a second frequency and varies with the second frequency, and wherein the second frequency is lower than the first frequency. Details will be illustrated in the following texts.

Figure 5:
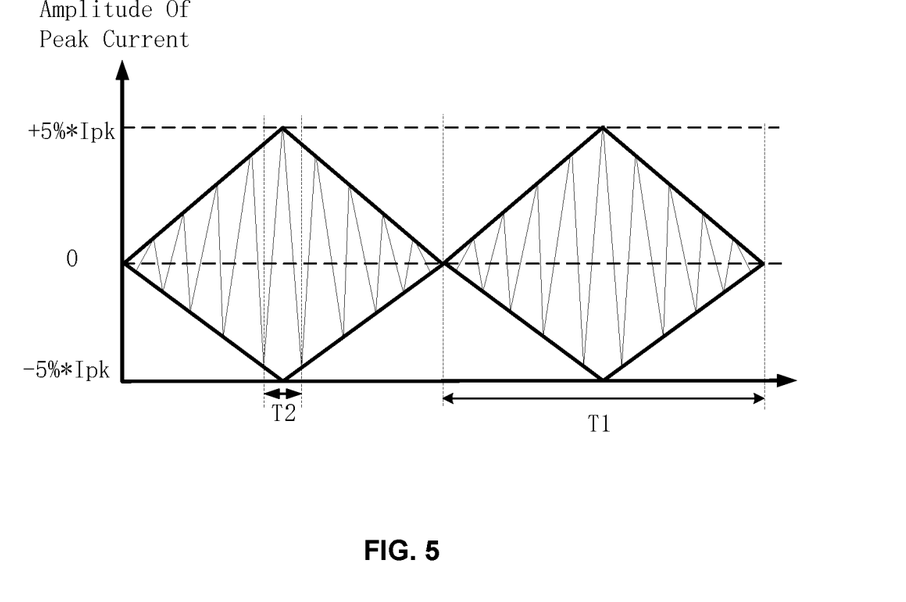
FIG. 5 illustrates a waveform diagram of an overlapping signal and its enveloping line for jittering the peak current value in a SMPS according to an embodiment of the present application.

FIG. 5 illustrates a waveform diagram of an overlapping signal and its enveloping line (in bold line) for jittering the peak current value in a SMPS according to an embodiment of the present application. The overlapping signal comprises triangle wave signals has a first frequency of 1/T2, and the enveloping line of the overlapping signal comprises diamond shaping signals which has a second frequency of 1/T1, wherein T2 is the first cycle period corresponding to the first frequency and T1 is the second cycle period corresponding to the second frequency. The second cycle period T1 is higher than the first cycle period T2 and the second frequency 1/T1 is lower than the first frequency 1/T2. And the first cycle period T2 is longer than the switching cycle period of the power switch such that the peak current have several different values in one first cycle period T2. In one embodiment, the first cycle period T2 is about 10 times of the switching cycle period and the second cycle period T1 is about 90 times of the switching cycle period, and the peak current is jittered to have about 90 different values. In one embodiment, the control circuit comprises an overlapping signal generating circuit configured to generate the overlapping signal, and referring to FIG. 8, the overlapping signal is generated based on a first control signal C1 and a second control signal C2.

In one embodiment, the peak current of the power switch is different between any two switching cycles in one second cycle period T1, and in one second cycle period T1, the more the switching cycle periods corresponding to the switching frequency contained, the better the EMI behavior is achieved. Or in other words, when the ratio of the switching frequency to the first frequency or the ratio of the switching frequency to the second frequency increases, the better EMI performance can be achieved.

In the shown embodiment in FIG. 5, the amplitude of the overlapping signal is 5%*Ipk, where Ipk corresponds to the peak current value or indicates the amplitude of a current threshold signal. And with this jittering method, the peak current has diverse values, and meanwhile, because the overlapping signal has low frequency, namely the second frequency, the jittering amplitude is not attenuated and remains approximately 5% of the peak current. And accordingly, the EMI performance is improved. In one embodiment, the overlapping signal in one first cycle period is scaled into at least three levels by switching period of the power switch.

Figure 6:
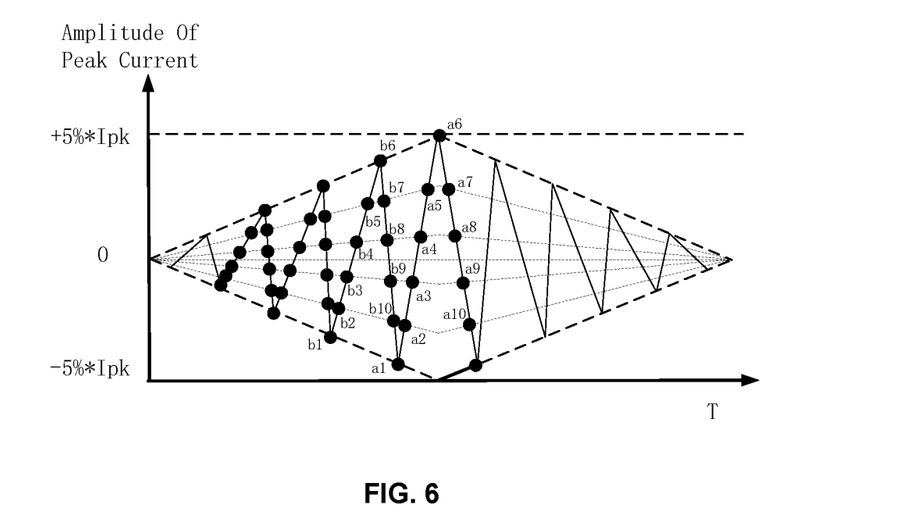
FIG. 6 illustrates a waveform diagram of an overlapping signal according to an embodiment of the present application.

FIG. 6 illustrates a waveform diagram of an overlapping signal in one second cycle period according to an embodiment of the present application. The overlapping signal varies in triangle waveform with a first frequency, and the enveloping line of the overlapping signal varies in diamond shape waveform with a second frequency. The second frequency is lower than the first frequency. The amplitude of the overlapping signal is scaled into 10 levels by the switching period cycles in one first cycle period, illustrated as levels a1, a2, a3, . . . , a10, or b1, b2, b3, . . . , and b10. The start value or start level in one first period cycle such as b1 or a1 of the overlapping signal is on the enveloping line of the overlapping signal, where a1 is farther than b1 from the base value 0 which means the absolute value of a1 is higher than that of b1, or the peak current value differs between two start points of two adjacent first cycle periods. And similarly, the value of a2 differs from b2, a3 differs from b3, and so on. Compared to the prior art as illustrated in FIG. 4, with the same first cycle period, the overlapping signal has only 5 levels in one first cycle period in FIG. 4 and the overlapping signal has 10 levels a1, a2, . . . a10 in one first cycle period according to the present application. And further, since the point values a1, a2, a3, ..., a10, b1, b2, b3, ..., and b10 between different first cycle periods in one second cycle period are different from each other, the overlapping signal has about 90 different values in one second cycle period. Accordingly, the peak current value is diverged and the EMI performance is improved.

In the embodiment as shown in FIG. 6, in one second cycle period, the scaled values among different first cycle periods are different wherein a scaled value is the value difference between two adjacent points, such as the value difference between b1 and b2, and the value difference between b1 and b2 is different from the value difference between a1 and a2, and wherein points b1 and b2 are in a different first cycle from points a1 and a2. In one embodiment, any two values of the overlapping signal scaled by the switching period cycles in one second cycle period are different. In another embodiment, some values of the overlapping signal in one second cycle period may be equal. And by adding the overlapping signal into the current sensing signal or the current threshold signal, the peak current value of the power switch is jittered with a plenty of different values, and accordingly, the frequency of the SMPS in quasi-resonant mode is jittered and diverged with a plenty of different values, and the EMI performance is greatly improved.

Figure 7A:
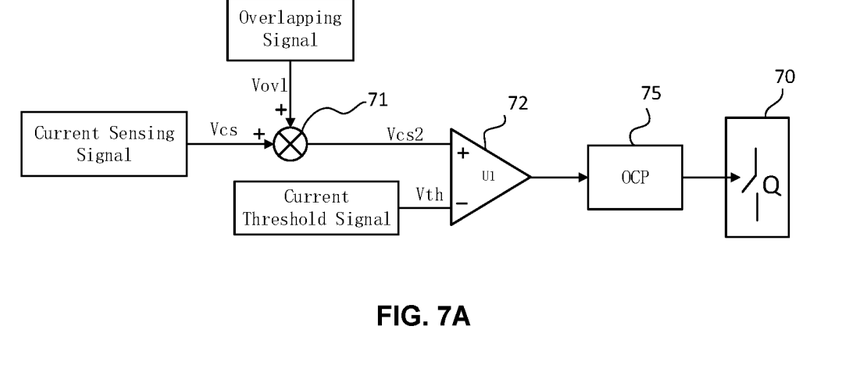
FIG. 7A illustrates a control circuit according to an embodiment of the present application.
Figure 7B:
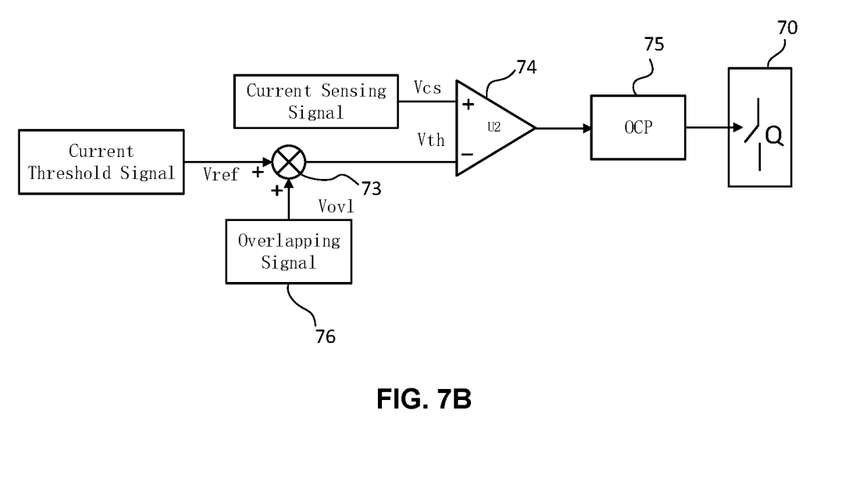
FIG. 7B illustrates another control circuit according to an embodiment of the present application.
Figure 8:
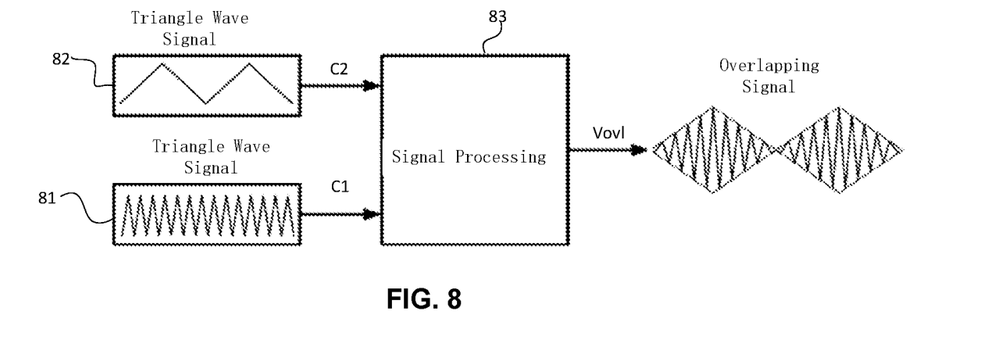
FIG. 8 illustrates an overlapping signal generating circuit according to an embodiment of the present application.

In one embodiment, a control circuit comprises an overlapping signal generating circuit wherein the output of the overlapping signal generating circuit provides an overlapping signal supplied to an input of a signal jittering circuit, and the overlapping signal generating circuit generates the overlapping signal based on the first control signal C1 and the second control signal C2 as illustrated in FIG. 8. The signal jittering circuit 71 or 73 as illustrated in FIG. 7A or FIG. 7B adds the overlapping signal Vovl into a current sensing signal Vcs or into a current threshold signal Vref to update the current sensing signal Vcs2 or current threshold signal Vcs.

FIG. 7A illustrates a control circuit according to an embodiment of the present application. The control circuit shown in FIG. 7A is a peak current control circuit for controlling the peak current of the power switch Q. The control circuit as illustrated in FIG. 7A comprises a signal jittering circuit 71 and a comparing circuit 72. The comparing circuit 72 compares a current sensing signal Vcs2 with a current threshold signal Vth. When the current sensing signal Vcs2 is higher than the current threshold signal Vth, a peak current control module 75 of the control circuit turns off the power switch Q of the SMPS 70 according to the output of the comparing circuit 72. The signal jittering circuit 71 adds an overlapping signal Vovl into a current sensing signal Vcs indicative of the current flowing through the power switch Q of a SMPS 70 to obtain the current sensing signal Vcs2. In one embodiment, the signal jittering circuit 71 comprises an adding circuit. The current sensing signal Vcs can be obtained by sensing the voltage across a current sensing resistor coupled in series with the power switch Q. The current threshold signal Vth can be a reference signal generated by a reference signal generating circuit, and can be a constant voltage signal. The overlapping signal Vovl, referring to FIG. 6, varies with a first frequency and the enveloping line or the amplitude of the overlapping signal Vovl varies with a second frequency and wherein the first frequency is higher than the second frequency and is lower than the switching frequency of the power switch. Accordingly, the peak current control module 75 controls the peak value of the current flowing through the power switch Q vary with the first frequency and the enveloping line of the peak value of the current vary with the second frequency. Where the peak value of the current or namely the peak current value of the power switch Q is the current value rightly before the power switch Q is turned off.

FIG. 7B illustrates another control circuit for controlling a power switch in a SMPS 70 according to an embodiment of the present application. In FIG. 7B, the signal jittering circuit 73 adds an overlapping signal Vovl into a current threshold signal Vref to update the current threshold signal Vth, and the current threshold signal Vth is provided to the inverting input of the comparing circuit 73. Wherein the non-inverting input of the comparing circuit 73 receives a current sensing signal Vcs indicative of the current flowing through the power switch Q of the SMPS 70. The overlapping signal Vovl varies with a first frequency and the enveloping line or the amplitude of the overlapping signal Vovl varies with a second frequency and wherein the first frequency is higher than the second frequency and is lower than the switching frequency of the power switch. Wherein the overlapping signal Vovl is generated by an overlapping signal generating circuit 76.

By adding such an overlapping signal, the peak current value is jittered and diverged, and the EMI performance is improved.

FIG. 8 illustrates an overlapping signal generating circuit according to an embodiment of the present application. The overlapping signal generating circuit comprises a first unit 81 configured to provide a first control signal C1, a second unit 82 configured to provide a second control signal C2 and a signal processing unit 83 configured to provide the overlapping signal Vovl based on the first control signal C1 and the second control signal C2. The first control signal C1 provided by the first unit 81 is adopted to control the overlapping signal Vovl have a basic form corresponding to the first control signal C1 with a first frequency, and the second control signal C2 provided by the second unit 82 is adopted to control the enveloping line of the overlapping signal Vovl correspond to the second control signal C2 with a second frequency, wherein the first frequency is higher than the second frequency.

In a preferred embodiment, the first control signal C1 is a triangle wave signal having a first frequency and the second control signal C2 is a triangle wave signal having a second frequency which is lower than the first frequency and by processing the first control signal C1 and the second control signal C2, the control circuit obtains an overlapping signal Vovl having a waveform shape as illustrated in FIG. 5, where the overlapping signal is a triangle wave signal varies with a high frequency and the outline or the enveloping line of the triangle wave signal varies with a low frequency.

In one embodiment, the first control signal is a high frequency triangle wave signal, and the second control signal is a low frequency sine wave signal, and by processing the first control signal and the second control signal, the overlapping signal comprises high frequency triangle wave signal and varies with a high frequency (first frequency), and the enveloping line of the overlapping signal varies in ellipsoid shape with a low frequency (second frequency). It is noted that either the triangle wave signal or the sine wave signal is in approximate sense, and the basic overlapping signal and the outline of the overlapping signal can be in other periodical forms. The first control signal C1 may be in the form of a high frequency triangle wave signal or a high frequency approximate sine wave signal, and the second control signal C2 may be in the form of a low frequency triangle wave signal or low frequency approximate sine wave signal. And an approximate sine wave signal comprises sine wave signal, half sine wave signal, trapezoid wave signal or other signal which is similar to the sine wave signal.

In one embodiment, the overlapping signal has the first frequency which is the same as that of the first control signal C1 and the frequency of the enveloping line is the same as the frequency of the second control signal C2. In another embodiment, the high frequency of the overlapping signal is M times or 1/M times of the frequency of the first control signal C1 and the lower frequency of the enveloping line of the overlapping signal is N times or 1/N times of the frequency of the second control signal C2, where M and N are natural numbers.

In one embodiment, the second control signal C2 is a sine wave signal, and the frequency of the second control signal C2 in sine wave signal is ½ of the frequency of the enveloping line of the overlapping signal. In another embodiment, the second control signal is a half sine wave signal, and the frequency of the second control signal is equal to the frequency of the enveloping line. It is noted that the first frequency and the second frequency may variable in a reasonable range.

In one embodiment, the first control signal C1 is a high frequency signal and the second control signal C2 is a low frequency signal and both of the two frequency is lower than the switching frequency of the power switch. For example, the high frequency is 10 times higher than the low frequency, and the switching frequency is 10 times higher than the frequency of the first control signal C1. In one embodiment, the high frequency of the first control signal C1 is the first frequency of the overlapping signal and the low frequency of the second control signal C2 is the second frequency of the overlapping signal.

Figure 9:
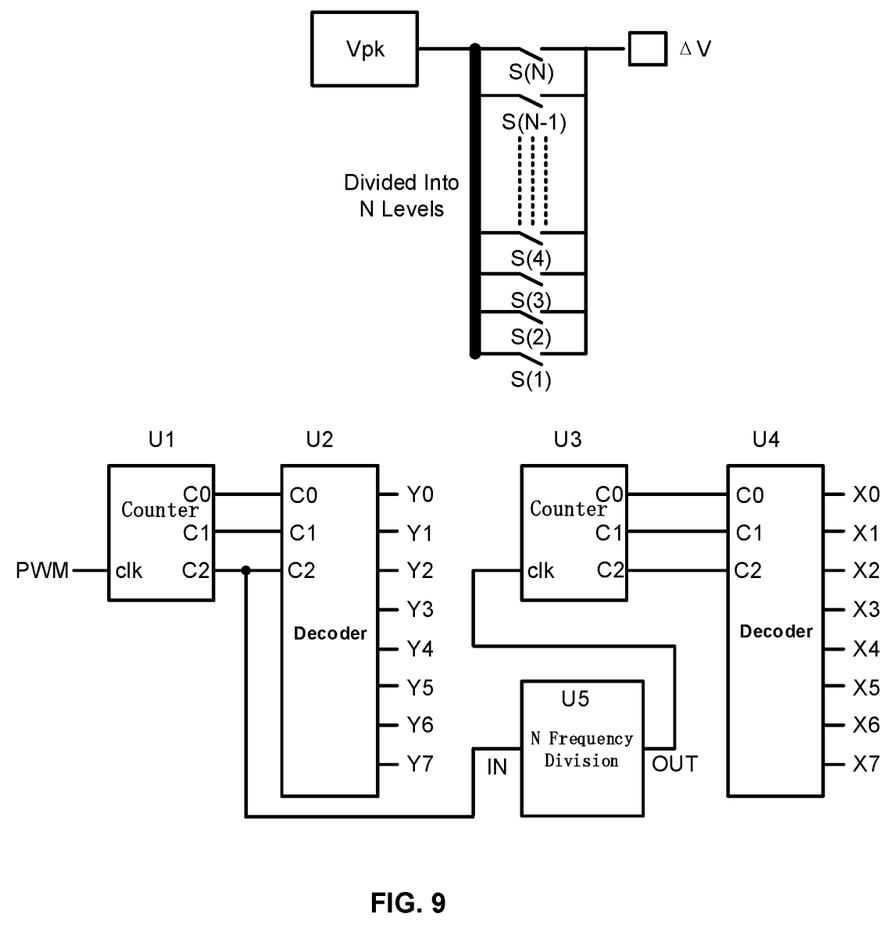
FIG. 9 illustrates a digital circuit for generating the overlapping signal according to an embodiment of the present application.

FIG. 9 illustrates a digital circuit for generating the overlapping signal namely an overlapping signal generating circuit as part of a control circuit according to an embodiment of the present application. In the shown embodiment, the overlapping signal generating circuit comprises a first control module and a second control module, wherein the first control module comprises a first counter U1 and a first decoder U2 configured to control the overlapping signal periodically varies with a higher frequency, and the second control module comprises a second counter U3 and a second decoder U4 configured to control the enveloping line of the overlapping signal periodically varies with a lower frequency. The first counter U1 is coupled to the first decoder U2, and the first decoder U2 is to assign at least 3 values to the overlapping signal in one first cycle period. The second decoder U4 is coupled to the second counter U3 configured to control the enveloping line of the overlapping signal having a second cycle period. The first cycle period corresponding to high frequency, or namely the first frequency is set by the decoder U2 and then enters into the second cycle period set by decoder U4. By obtaining the output of the first decoder U2 and the output of the second decoder U4, an overlapping signal is generated having a high frequency periodic signal component and a low frequency periodic signal component, as illustrated in FIG. 5. In another embodiment, the output of the second decoder U4 is coupled to the first decoder U2, and the overlapping signal is obtained at the output of the first decoder U2. In one embodiment, the maximum peak current jittering amplitude Vpk in one first cycle period is divided into N levels, preferably equally, with amplitude of Vpk*1/N, Vpk*2/N, Vpk*3/N, . . . and Vpk*N/N. Each amplitude is set at each switching cycle determined by the signal PWM input to the first counter U1. The maximum peak current jittering amplitude Vpk varies in different first cycle periods periodically, for example, as illustrated as of X0, X1, X2, . . . and X7. Wherein in a first cycle period corresponding to X0, the maximum peak current jittering amplitude Vpk is Vpk_X0, and Vpk_X0 is divided into four levels with amplitudes of Vpk_X0*¼, Vpk_X0*²⁄₄, Vpk_X0*¾, Vpk_X0*4/4. And the four levels are assigned to Y0, Y0, . . . and Y7, where Y0 is assigned as Vpk_X0*¼, Y1 as Vpk_X0*²⁄₄, Y2 as Vpk_X0*¾, Y3 as Vpk_X0*4/4, Y4 as Vpk_X0*4/4, Y5 as Vpk_X0*¾, Y6 as Vpk_X0*²⁄₄, and Y7 as Vpk_X0*¼. Similarly, in a first cycle period corresponding to X1, the maximum peak current jittering amplitude Vpk is Vpk_X1, and Vpk_X1 is divided into four levels with amplitudes of Vpk_X1*¼, Vpk_X1*²⁄₄, Vpk_X1*¾, Vpk_X1*4/4, and the four levels are assigned to Y0, Y0, . . . and Y7, where Y0 is assigned as Vpk_X1*¼, Y1 as Vpk_X1*²⁄₄, Y2 as Vpk_X1*¾, Y3 as Vpk_X1*4/4, Y4 as Vpk_X1*4/4, Y5 as Vpk_X1*¾, Y6 as Vpk_X1*²⁄₄, and Y7 as Vpk_X1*¼. In the rest first cycle periods corresponding to X2 to X7 in one second cycle period, the output of Y0, Y1, . . . and Y7 are assigned similarly. And the outputs Y0 to Y7 of the first decoder U1 sequentially considering the outputs X0 to X7 of the second decoder U2 determine an overlapping signal as illustrated in FIG. 5. The second cycle periods repeat.

In one embodiment, the overlapping signal generating circuit further comprises a frequency divider U5, wherein an input of the frequency divider U5 is coupled to the first control module and an output of the frequency divider U5 is coupled to the second control module. In an embodiment when without the frequency divider, the waveform of the overlapping signal in each first cycle period has one predetermined form, however, with the frequency divider, in each first cycle period the overlapping signal will have several such predetermined forms. In one embodiment, the predetermined form is one triangle waveform, and the overlapping signal has a plurality of triangle waveforms in one first cycle period. In one embodiment, the frequency divider is a quad divider, and there may exit four triangle waveforms in one first cycle period.

As illustrated above, according to one embodiment of the present application, a control method for controlling a power switch comprises the below two steps. In a first step, the method comprises jittering a current sensing signal indicative of the current flowing through the power switch with an overlapping signal, which is to add the overlapping signal to the current sensing signal to obtain an updated current sensing signal, wherein the overlapping signal varies with a first frequency and an enveloping line of the overlapping signal varies with a second frequency, and wherein the second frequency is lower than the first frequency. And in a second step, the method comprises comparing the current sensing signal with a current threshold signal, and when the current sensing signal is higher than the current threshold signal, the power switch is turned off. It is noted that the first step and the second step are not to limit the order, and the two steps may be exercised continuously or simultaneously.

In another embodiment, the overlapping signal is added into the current threshold signal to form a new current threshold signal having a first frequency and a second frequency which is lower than the first frequency. In one embodiment, the current threshold signal having the first frequency and the second frequency is generated by an overlapping signal generating circuit directly.

In one embodiment, the step of adding the overlapping signal into the current sensing signal or the current threshold signal comprises generating the overlapping signal according to a first control signal and a second control signal, wherein the frequency of the first control signal corresponds to the first frequency and the frequency of the second control signal corresponds to the second frequency. The term of "correspond" here means the frequency of the first control signal equals the first frequency or the frequency of the second control signal equals the second frequency, or, the frequency of the first control signal is m times or 1/m times of the first frequency or the frequency of the second control signal is n times or 1/n times of the second frequency, where m and n are natural numbers.

In one embodiment, the waveform shape of the overlapping signal corresponds to the first control signal and varies with the first frequency, and the waveform shape of the enveloping line of the overlapping signal corresponds to the second control signal and has the second frequency.

In one embodiment, the first frequency is a high frequency and the second frequency is a low frequency and the first frequency is lower than the switching frequency of the power switch of SMPS.

In some embodiments, the first control signal is high frequency triangle wave signal or low frequency approximate sine wave signal, and the second control signal is low frequency triangle wave signal or low frequency approximate sine wave signal.

In one embodiment, the overlapping signal in one first cycle period corresponding to the first frequency is scaled into at least three levels, wherein each level corresponds to a peak current value in a specific switching cycle period. Preferably, the number of levels in one first cycle period is between 6 and 15. In a preferred embodiment, any two peak current values for any two switching cycles in one first cycle period are different. In one embodiment, the scaled values among different first cycle periods in one second cycle period corresponding to the second frequency are different. The scaled value refers to the voltage difference of the overlapping signal between two adjacent levels in a first cycle period. In one embodiment, any two peak current levels in one second cycle period have different values. Accordingly, the peak current of the power switch has multiple values in one first cycle period and has much more different values in one second cycle period. In one embodiment, the peak current of the power switch has at least three different values in one first cycle period corresponding to the first frequency, and wherein the peak current values between each two adjacent first cycle periods are different.

With the overlapping signal having a first frequency and the enveloping line of the overlapping signal having a second frequency lower than the first frequency, wherein the first frequency is lower than the switching frequency, the peak current of the corresponding power switch is jittering with diverse amplitudes. Meanwhile, since the overlapping signal has a high frequency (first frequency), the jittering amplitude of the peak current will not be attenuated by the feedback loop. Accordingly, the EMI performance is greatly improved.

The advantages and effects in the description may not show in specific examples considering variable conditions and the results may further be affected by other factors as not mentioned.

It will be appreciated by persons skilled in the art that the present invention is not limited to what been particularly shown and described herein above. Rather the scope of the present invention is defined by the claims and includes both combinations and sub-combinations of the various features described herein above as well as variations and modifications thereof which would occur to persons skilled in the art upon reading the foregoing description and which are not in the prior art.

We claim:

1. A control circuit for controlling an power switch in a Switching Mode Power Supply (SMPS), the control circuit comprising:
a signal jittering circuit configured to add an overlapping signal into a current sensing signal indicative of a current flowing through the power switch to update the current sensing signal or into a current threshold signal to update the current threshold signal, wherein the overlapping signal has a first frequency and an enveloping line of the overlapping signal has a second frequency, and wherein the second frequency is lower than the first frequency; and
a comparing circuit configured to compare the current sensing signal with the current threshold signal, wherein when the current sensing signal is higher than the current threshold signal, the control circuit is configured to turn off the power switch.

2. The control circuit of claim 1, further comprising an overlapping signal generating circuit configured to provide the overlapping signal, wherein the overlapping signal generating circuit generates the overlapping signal based on a first control signal and a second control signal, and wherein the first control signal corresponds to the first frequency and the second control signal corresponds to the second frequency.

3. The control circuit of claim 2, wherein the first control signal has the first frequency and the second control signal has the second frequency.

4. The control circuit of claim 2, wherein the first control signal is in a form of a triangle wave signal corresponding to the first frequency and the second control signal is in a form of a triangle wave signal corresponding to the second frequency.

5. The control circuit of claim 2, wherein the first control signal is in a form of an approximate sine wave signal having a higher frequency and the second control signal is in a form of an approximate sine wave signal having a lower frequency.

6. The control circuit of claim 1, wherein the first frequency is lower than the switching frequency of the power switch.

7. The control circuit of claim 1, wherein the overlapping signal in one first cycle period corresponding to the first frequency is scaled into at least three levels by the switching period of the power switch.

8. The control circuit of claim 7, wherein scaled values among different first cycle periods in one second cycle period corresponding to the second frequency are different.

9. The control circuit of claim 1, further comprising a first control module and a second control module, wherein the first control module is configured to control the overlapping signal to periodically vary at the first frequency, and the second control module is configured to control the enveloping line of the overlapping signal to periodically vary at the second frequency.

10. The control circuit of claim 9, wherein:
the first control module comprises a first counter and a first decoder coupled to the first counter configured to assign at least three values to the overlapping signal in a first cycle period corresponding to the first frequency; and
the second control module comprises a second counter and a second decoder coupled to the second counter configured to control the enveloping line of the overlapping signal in a second cycle period corresponding to the second frequency.

11. The control circuit of claim 9, further comprising a frequency divider having an input coupled to the first control module and having an output coupled to the second control module.

12. The control circuit of claim 1, wherein when the current flowing through the power switch decreases to zero, the power switch is turned on.

13. A control circuit for controlling a power switch in an SMPS, comprising a peak current control circuit configured to turn off the power switch when a current flowing through the power switch exceeds a threshold, and the peak current control circuit further configured to control a peak value of the current to vary at a first frequency and control an enveloping line of the peak value to vary at a second frequency, wherein the second frequency is lower than the first frequency.

14. A control method for controlling a power switch in a SMPS, comprising:
  jittering a current sensing signal indicative of current flowing through the power switch with an overlapping signal or jittering a current threshold signal with the overlapping signal, wherein the overlapping signal varies with a first frequency and an enveloping line of the overlapping signal varies with a second frequency, and wherein the first frequency is higher than the second frequency; and
  comparing the current sensing signal with the current threshold signal, and turning off the power switch when the current sensing signal is higher than the current threshold signal.

15. The control method of claim 14, wherein step of jittering the current sensing signal or current threshold signal with the overlapping signal comprises:
  generating the overlapping signal according to a first control signal and a second control signal, and wherein the first control signal corresponds to the first frequency and the second control signal corresponds to the second frequency; and
  adding the overlapping signal into the current sensing signal or the current threshold signal.

16. The control method of claim 15, wherein the first control signal is in a form of a triangle wave signal having the first frequency and the second control signal is in a form of a triangle wave signal having the second frequency.

17. The control method of claim 15, wherein the first control signal is in a form of a sine wave signal having the first frequency and the second control signal is in a form of a sine wave signal having the second frequency.

18. The control method of claim 14, wherein the first frequency is lower than the switching frequency of the power switch.

19. The method of claim 14, wherein peak current of the power switch has at least three different values in one first cycle period corresponding to the first frequency, and wherein peak current values between each two adjacent first cycle periods are different.

* * * * *